(12) United States Patent
Fiedler (10) Patent No.: US 6,377,079 B1
(45) Date of Patent: Apr. 23, 2002

(54) DATA SERIALIZER WITH SLEW-RATE CONTROL

(75) Inventor: Alan S. Fiedler, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/783,231

(22) Filed: Feb. 14, 2001

Related U.S. Application Data (60) Provisional application No. 60/237,414, filed on Oct. 2, 2000.

(51) Int. Cl.[7] .............................................. H03K 19/096
(52) U.S. Cl. ............................ 326/96; 326/105; 326/93; 327/298; 708/272
(58) Field of Search ............................ 326/93–98, 104, 326/105, 26, 27; 327/298; 708/272

(56) References Cited

U.S. PATENT DOCUMENTS

| | | | | |
|---|---|---|---|---|
| 5,955,897 A | * | 9/1999 | Narayana et al. | 326/105 |
| 6,087,855 A | * | 7/2000 | Frederick, Jr. et al. | 326/106 |
| 6,268,746 B1 | * | 7/2001 | Potter et al. | 326/93 |
| 6,271,682 B1 | * | 8/2001 | Lindsay | 326/93 |

* cited by examiner

*Primary Examiner*—Michael Tokar
*Assistant Examiner*—Vibol Tan
(74) *Attorney, Agent, or Firm*—Westman, Champlin & Kelly (57) ABSTRACT

A data serializer includes a differential output stage. The differential output stage has n pairs of first and second control inputs, wherein each pair of control inputs corresponds to one of n data inputs and n is an integer greater than one. Each pair of first and second control inputs is driven by a respective logic AND circuits having a rise time controlled by a first adjustable controlled current source and a fall time controlled by a second adjustable controlled current source.

16 Claims, 4 Drawing Sheets

DATA SERIALIZER WITH SLEW-RATE CONTROL

CROSS-REFERENCE TO RELATED APPLICATION

This application claims priority from U.S. Provisional Application No. 60/237,414 filed Oct. 2, 2000, and entitled "LOW-POWER DATA SERIALIZER WITH SLEW-RATE CONTROL."

Cross reference is also made to U.S. application Ser. No. 09/782,806, entitled "LOW-POWER DATA SERIALIZER," U.S. application Ser. No. 09/782,842, entitled "RESISTIVELY-LOADED CURRENT-MODE OUTPUT BUFFER WITH SLEW RATE CONTROL," and U.S. application Ser. No. 09/783,690, entitled "REDUCED-SWING DIFFERENTIAL OUTPUT BUFFER WITH IDLE FUNCTION," which were filed on even date herewith.

BACKGROUND OF THE INVENTION

The present invention relates to high-speed serial data transceivers and, in particular, high-speed data serializers.

Serial data communication circuits use data serializers for converting a plurality of parallel data inputs to a single serial data stream. A typical data serializer includes a time-division data multiplexer, which sequentially multiplexes the parallel data outputs to a single output. The sequential selection of data inputs is controlled by a clock circuit which has two or more phases. A typical multi-phase clock circuit generates n select clock signals. The n select clock signals are equally distributed in phase over 360 degrees. The select clock signals are used to select individual data inputs in a particular order.

A given high speed data serializer is more valuable if it can be adapted for different applications, and in particular for different data rates. But different data rates can have different slew rate requirements. It is therefore desirable to be able to use the same data serializer for different applications (i.e., at different data rates) and also to adjust the slew rate of the serializer for each application. Existing approaches for adjusting the slew rate often use feedback techniques. A buffer's output slew rate is monitored and, through feedback, the signal at the input to the buffer is controlled so as to achieve the desired output slew rate. However, to ensure stable operation, the bandwidth and/or the gain of the feedback loop must be limited. The result is an imperfect slew rate control. Another problem is that the devices connected to the output signal whose slew rate is being monitored (so as to control its slew rate) are susceptible to damage from electrostatic discharge.

A data serializer having improved slew rate control is desired.

SUMMARY OF THE INVENTION

A data serializer according to one embodiment of the present invention includes a differential output stage. The differential output stage has n pairs of first and second control inputs, wherein each pair of control inputs corresponds to one of n data inputs and n is an integer greater than one. Each pair of first and second control inputs is driven by a respective logic AND circuit having a rise time controlled by a first adjustable controlled current source and a fall time controlled by a second adjustable controlled current source.

One aspect of the present invention is directed to a data serializer, which includes n data inputs, n clock inputs, a differential output stage and an input stage. Each clock input is out of phase with the other clock inputs and corresponds to one of the n data inputs. The differential output stage has first and second differential data outputs and n pairs of first and second control inputs, wherein each pair of control inputs corresponds to one of the n data inputs. The input stage includes, for each of the n data inputs, a first logic AND circuit and a second logic AND circuit The first logic AND circuit has first, second and third inputs coupled to the data input, the corresponding clock input and an inverse of the clock input that next trails the corresponding clock input in phase, respectively, and has an output which is coupled to the first control input of the corresponding pair of control inputs. The output of the first logic AND gate has a rise time controlled by a first adjustable controlled current source and a fall time controlled by a second adjustable controlled current source. The second logic AND gate circuit has first, second and third inputs coupled to an inverse of the data input, the corresponding clock input and the inverse of the clock input that next trails the corresponding clock input in phase, respectively, and an output which is coupled to the second control input of the corresponding pair of control inputs. The output of the second logic AND gate has a rise time controlled by the first adjustable controlled current source and a fall time controlled by the second adjustable controlled current source.

Another aspect of the present invention is directed to a method of serializing a parallel data input having n data inputs. The method includes providing n differential transistor pairs in parallel with one another, between first and second differential data outputs and a tail current source. Each transistor pair has a respective pair of first and second control inputs. The method further includes receiving the n data inputs and n clock signals, wherein each clock signal is out of phase with the other clock signals and corresponds to one of the n data inputs. For each of the n data inputs received, the respective pair of first and second control inputs is driven between first and second voltage levels with a rise time controlled by a first adjustable controlled current source and a fall time controlled by a second adjustable controlled current source, based on logic states of the corresponding data input, the corresponding clock signal and the clock signal that next trails the corresponding clock signal in phase.

DETAILED DESCRIPTION OF ILLUSTRATIVE EMBODIMENTS

Figure 1:
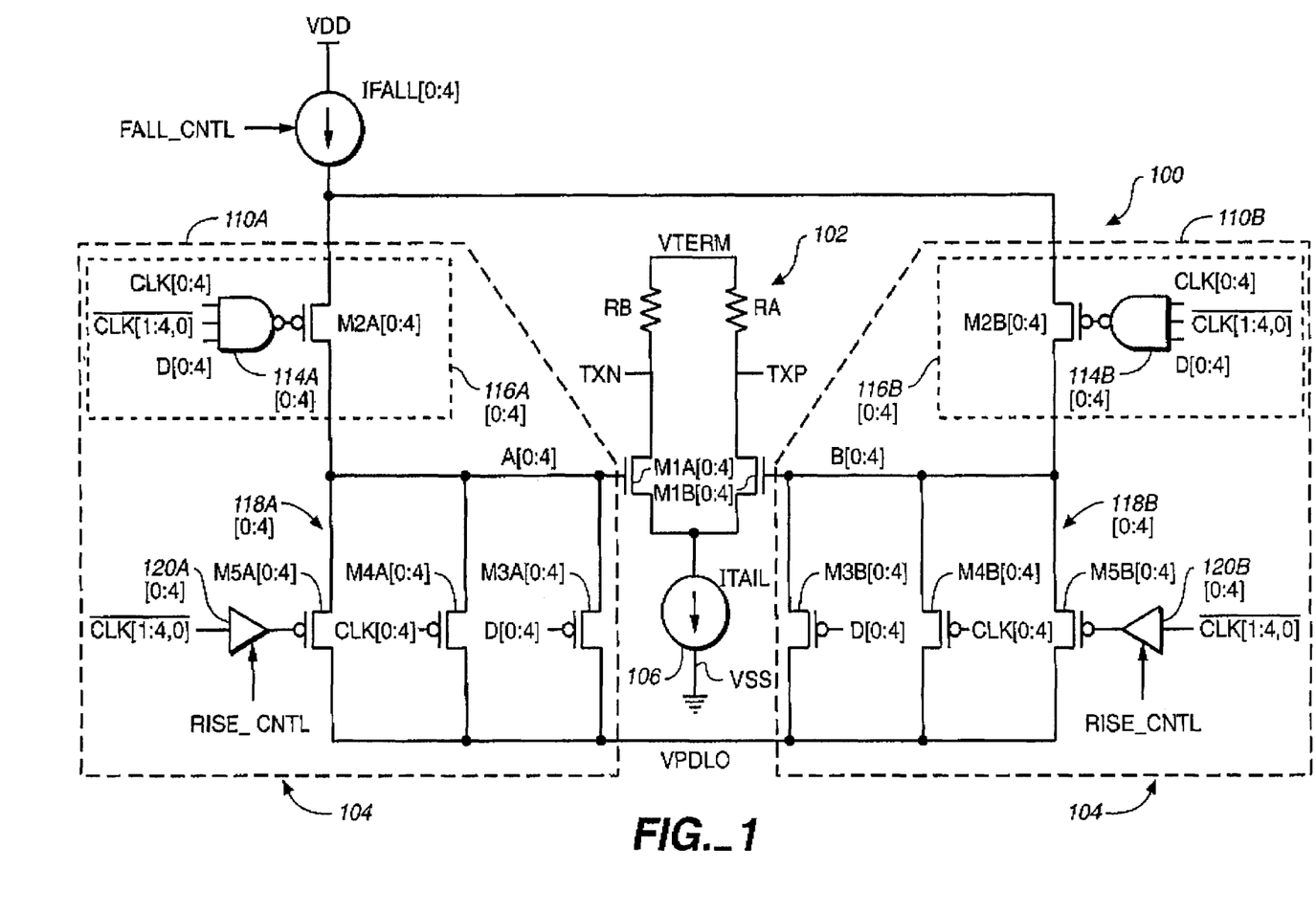
FIG. 1 is a schematic diagram of a data serializer according to one embodiment of the present invention.

FIG. 1 is a schematic diagram of a data serializer according to one embodiment of the present invention. Data serializer 100 is configured as a 5:1 data serializer. However, data serializer 100 can be configured as any n:1 data serializer in alternative embodiments, where n is an integer greater than one. FIG. 1 and the following description describe the case of n=5. All bold circuit elements and buses in FIG. 1 depict arrays of five devices or nets. Where a bus connects to an array of circuit elements, each net in the bus connects to one element in the array. Where a single, non-bolded net is connected to a pin in an array of circuit elements, this indicates that this pin on each circuit element in the array is connected to the same pin in the other elements in the array and also to this net.

Data serializer 100 has an output stage 102 and an input stage 104. Output stage 102 includes tail current source 106, an array of differential n-channel transistor pairs M1A[0:4] and M1B[0:4], differential data outputs TXP and TXN and load resistors RA and RB. Tail current source 106 generates a tail current ITAIL and is coupled between the sources of transistors M1A[0:4] and M1B[0:4] and voltage supply terminal VSS (e.g., ground). The drains of each transistor M1A[0:4] are coupled to data output TXN, and the drains of transistors M1B[0:4] are coupled to data output TXP. Differential data outputs TXP and TXN are coupled to termination voltage supply terminal VTERM through load resistors RA and RB, respectively. Load resistors RA and RB may be on-chip, off-chip, or both on-chip and off-chip. Resistors R1 and R2 represent the net effective load resistance connected to OUTP and OUTM, respectively.

One of the transistors in transistor arrays M1A[0:4] and M1B[0:4] connects tail current source 106 to TXP or TXN, depending on the relative voltages on the gates of each transistor in the arrays. Thus, one of the differential outputs TXP and TXN will be pulled low by tail current source 106, and the other will be pulled high through the respective load resistor RA or RB. The gates of transistors M1A[0:4] are coupled to respective nets in bus A[0:4], and the gates of transistors M1B[0:4] are coupled to respective nets in bus B[0:4]. As described in more detail below, input stage 104 drives one of the transistors M1A[0:4] and M1B[0:4] to an on state, through buses A[0:4] and B[0:4].

Input stage 104 has parallel data inputs D[0:4], inverted data inputs $\overline{D[0:4]}$, corresponding clock inputs CLK[0:4] and $\overline{CLK[0:4]}$ and first and second logic AND circuits 110A and 110B. Each clock input CLK[0:4] is out of phase with the other clock inputs CLK[0:4]. In one embodiment, the phases of clock inputs CLK[0:4] are evenly distributed over 360 degrees.

Logic AND circuit 110A includes arrays of p-channel output drive transistors M2A[0:4], M3A[0:4], M4A[0:4] and M5A[0:4] and NAND gates 114A[0:4]. Drive transistors M2A[0:4] and NAND gates 114A[0:4] together form respective pull-up AND gates 116A[0:4], which drive bus A[0:4] between two logic states, a logic high state and a high impedance state, depending on the logic states of CLK[0:4], $\overline{CLK[1:4,0]}$ and D[0:4].

Each of the transistors M2A[0:4] is coupled between a respective net in bus A[0:4] and a respective controlled current source IFALL[0:4], which is coupled to voltage supply terminal VDD. Each current source IFALL[0:4] has a current level control terminal coupled to current control input FALL_CNTL. Current sources IFALL[0:4] and transistors M2A[0:4] together act as switched current sources for providing controlled currents to ramp the respective nets in bus A[0:4] toward the voltage on voltage supply terminal VDD when the respective transistors M2A[0:4] are in the on state. Thus, the level of current provided by current sources IFALL[0:4] controls the rise times of the nets in bus A[0:4], and by extension, the fall time of output TXN.

The gate of each transistor M2A[0:4] is coupled to the output of a respective NAND gate 114A[0:4]. Each NAND gate 114A[0:4] has a first input coupled to a respective clock input CLK[0:4], a second input coupled to a respective inverted clock input $\overline{CLK[1:4,0]}$ and a third input coupled to a respective data input D[0:4]. With this circuit configuration, each pull-up AND gate 116A[n] pulls the respective net A[n] high toward the voltage on voltage supply terminal VDD when all of the inputs D[n], CLK[n] and $\overline{CLK[n+1]}$ are high. When any of the inputs D[n], CLK[n] and $\overline{CLK[N+1]}$ are low, pull-up AND gate 116A[n] is seen as a high impedance to the respective net A[n].

Drive transistors M3A[0:4], M4A[0:4] and M5A[0:4] together form respective pull-down AND gates 118A[0:4], which drive bus A[0:4] between two logic states, a logic low state and a high impedance state, depending on the logic states of clock inputs CLK[0:4], inverted clock inputs $\overline{CLK[1:4,0]}$ and data inputs D[0:4]. Inverted clock inputs $\overline{CLK[1:4,0]}$ are buffered by buffers 120A[0:4]. As described in more detail below, each buffer 120A[0:4] has a current level control terminal coupled to current control input RISE_CNTL for controlling the fall time at its output, and by extension, the fall time of the nets in bus A[0:4] and the rise time of output TXN.

Each transistor M3A[0:4], M4A[0:4] and M5A[0:4] is coupled between a respective net in bus A[0:4] and voltage supply terminal VPDLO. The gate of each transistor M3A[0:4] is coupled to a respective data input D[0:4]. The gate of each transistor M4A[0:4] is coupled to a respective clock input CLK[0:4]. The gate of each transistor M5A[0:4] is coupled to a respective buffered clock input $\overline{CLK[1:4,0]}$ at the outputs of buffers 120A[0:4]. Each pull-down AND gate 118A[n] pulls the respective net A[n] low toward the voltage on voltage supply terminal VPDLO when any of the inputs D[n], CLK[n] and CLK[n+1] are low. When all of the inputs D[n], CLK[n] and $\overline{CLK[n+1]}$ are high, the output of AND gate 118A[n] is a high impedance.

Similarly, logic AND circuit 110B includes arrays of p-channel drive transistors M2B[0:4], M3B[0:4], M4B[0:4] and M5B[0:4] and NAND gates 114B[0:4]. Drive transistors M2B[0:4] and NAND gates 114B[0:4] together form respective pull-up AND gates 116B[0:4], which drive bus B[0:4] between two logic states, a logic high state and a high impedance state, depending on the logic states of clock inputs CLK[0:4], inverted clock inputs $\overline{CLK[1:4,0]}$ and inverted data inputs $\overline{D[0:4]}$.

Each of the transistors M2B[0:4] is coupled between a respective net in bus B[0:4] and a respective one of the controlled current sources IFALL[0:4]. Current sources IFALL[0:4] and transistors M2B[0:4] together act as switched current sources for providing controlled currents to ramp the respective nets in bus B[0:4] toward the voltage on voltage supply terminal VDD when the respective transistors M2B[0:4] are in the on state. Thus, the level of current provided by current sources IFALL[0:4] controls the rise times of the nets in bus B[0:4], and by extension, the fall time of output TXP.

The gate of each transistor M2B[0:4] is coupled to the output of a respective NAND gate 114B[0:4]. Each NAND gate 114B[0:4] has a first input coupled to a respective clock input CLK[0:4], a second input coupled to a respective clock input $\overline{CLK[1:4,0]}$ and a third input coupled to a respective inverted data input $\overline{D[0:4]}$. With this circuit configuration, each pull-up AND gate 116B[n] pulls the respective net B[n]

high toward the voltage on voltage supply terminal VDD when all of the inputs $\overline{D[n]}$, CLK[n] and CLK[n+1] are high. When any of the inputs $\overline{D[n]}$, CLK[n] and $\overline{CLK[n+1]}$ are low, pull-up AND gate 116B[n] is seen as a high impedance to the respective net B[n].

Drive transistors M3B[0:4], M4B[0:4] and M5B[0:4] together form respective pull-down AND gates 118B[0:4], which drive bus B[0:4] between two logic states, a logic low state and a high impedance state, depending on the logic states of clock inputs CLK[0:4], inverted clock inputs $\overline{CLK[1:4,0]}$ and inverted data inputs D[0:4]. Inverted clock inputs $\overline{CLK[1:4,0]}$ are buffered by buffers 120B[0:4]. In an alternative embodiment, buffers 120B[0:4] are removed and the outputs of buffers 120A[0:4] drive the gates of transistors M5B[0:4]. As described in more detail below, each buffer 120B[0:4] has current level control terminal coupled to current control input RISE_CNTL for controlling the fall times of the nets in bus B[0:4] and by extension, the rise time of output TXP.

Each transistor M3B[0:4], M4B[0:4] and M5B[0:4] is coupled between a respective net in bus B[0:4] and voltage supply terminal VPDLO. The gate of each transistor M3B[0:4] is coupled to a respective inverted data input $\overline{D[0:4]}$. The gate of each transistor M4B[0:4] is coupled to a respective clock input $\overline{CLK[0:4]}$. The gate of each transistor M5B[0:4] is coupled to a respective inverted clock $\overline{CLK[1:4,0]}$ at the outputs of buffers 120B[0:4]. Each pull-down AND gate 118B[n] pulls the respective net B[n] low toward the voltage on voltage supply terminal VPDLO when any of the inputs $\overline{D[n]}$, CLK[n] and $\overline{CLK[n+1]}$ are low. When all of the inputs D[n], CLK[n] and $\overline{CLK[n+1]}$ are high, the output of AND gate 118B[n] is a high impedance.

For each data input D[0:4] (and inverted data input $\overline{D[0:4]}$), input stage 104 generates a pulse on the respective net in bus A[0:4] or B[0:4] depending on whether that data input is high or low. Clock inputs CLK[0:4] (and inverted clock inputs $\overline{CLK[0:4]}$) are used to time-multiplex the data inputs D[0:4] such that only one of nets in both buses A[0:4] and B[0:4] is pulsed high at one time.

For example on the "A" side of input stage 104, if data bit D[0] is a "1", NAND gate 114A[0] turns on pull-up transistor M2A[0] to provide a pulse on A[0] only when the corresponding clock signal CLK[0] is high and the next clock signal CLK[1] trailing in phase from CLK[0] is low. When either CLK[0] is low or CLK[1] is high, NAND gate 114A[0] turns off pull-up transistor M2A[0], and one or both of the pull-down transistors M4A[0] or M5A[0] pulls net A[0] low.

On the "B" side of input stage 104 during the time interval in which CLK[0] is high and CLK[1] is low, if $\overline{D[0]}$ is a "0", NAND gate 114B[0] ensures pull-up transistor M12B[0] is off, and pull-down transistor M3B[0] is on, which holds net B[0] low at VPDLO. Thus, transistor M1A[0] receives a pulse, and transistor M1B[0] receives no pulse. Transistor M1A[0] turns on, pulling data output TXN low toward VSS. Transistor M1B[0] remains off, and data output TXP is pulled high through load resistor RA. The result is a positive pulse on differential data outputs TXP and TXN (TXP-TXN).

Figure 2:
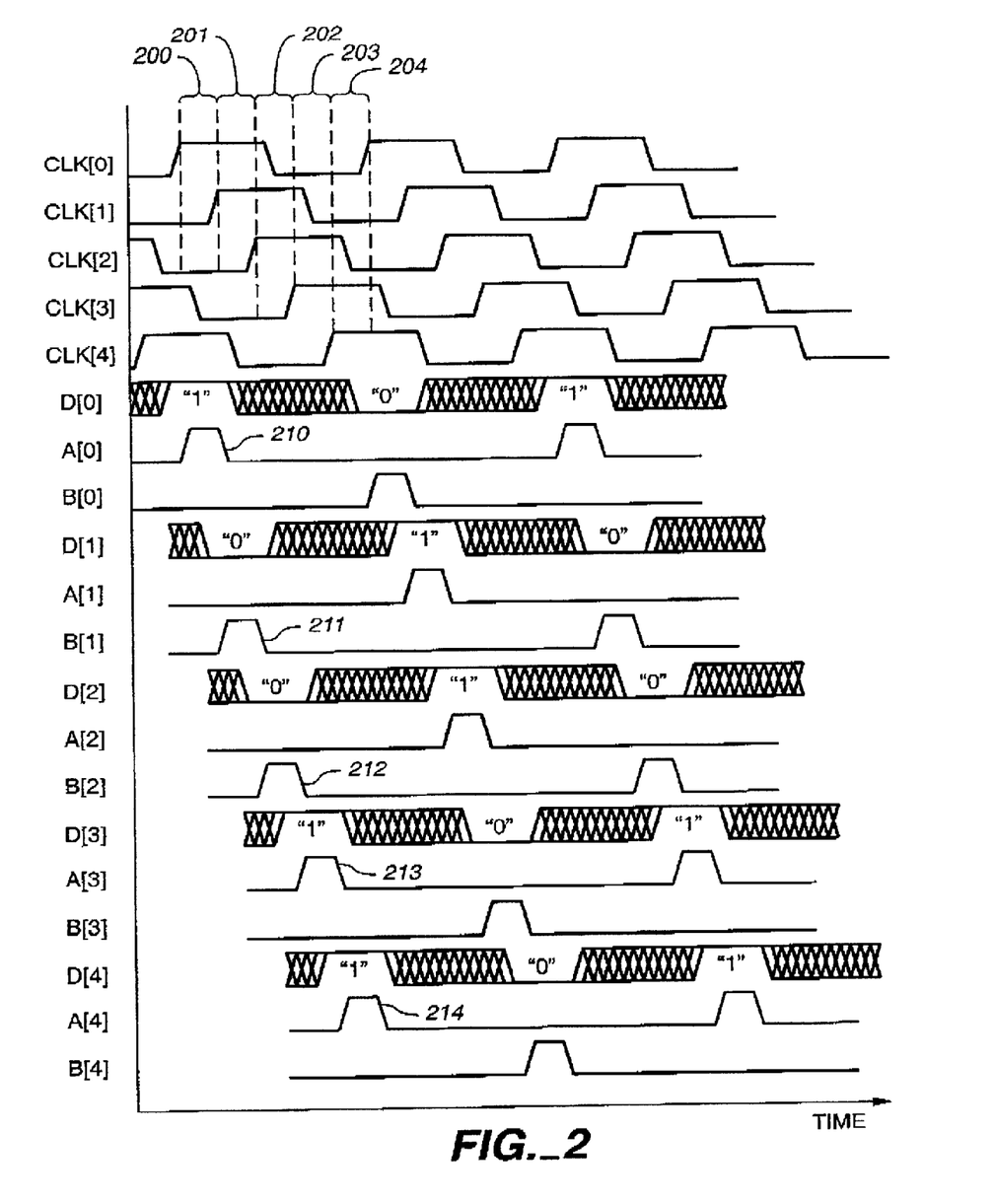
FIG. 2 is a timing diagram, which shows clock inputs, data inputs and intermediate pulsed output signals of the data serializer shown in FIG. 1 over time.

FIG. 2 is a timing diagram which shows clock signals CLK[0]–CLK[4], data signals D[0]–D[4], and intermediate, pulsed output signals A[0]–A[4] and B[0]–B[4] versus time. For simplicity, the slew-rates of output signals A[0]–A[4] and B[0]–B[4] in FIG. 2 are shown at a nominal level. FIG. 2 shows an example in which data serializer 100 serializes the sequence "100110110010011".

Individual clock signals CLK[0]–CLK[4] are shown at the top of the diagram. Each clock signal is out-of-phase with the other clock signals, and the clock signals are evenly distributed in phase over 360 degrees. In data signals D[0]–D[4], the regions that are not cross-hatched indicate time periods during which that data signal must be valid. Each data signal D[n] must be valid only when CLK[n] is high and the next clock signal CLK[n+1] that is next trailing CLK[n] in phase is low.

For example, during time interval 200, clock signal CLK[0] is high, clock signal CLK[1] is low and data signal D[0] is high. As described with reference to FIG. 1 above, a logic high value on data input D[0] during time interval 200 results in a pulse 210 in intermediate output signal A[0] and no pulse in intermediate output signal B[0].

During time interval 201, clock signal CLK[1] is high and clock signal CLK[2] is low. In this time interval, data signal D[1] is low resulting in no pulse in intermediate output signal A[1] and a pulse 211 in intermediate output signal B[1]. During time interval 202, clock signal CLK[2] is high and clock CLK[3] is low. In this time interval, data signal D[2] is low resulting in no pulse in intermediate output A[2] and a pulse 212 in intermediate output B[2]. During time interval 203, clock signal CLK[3] is high and clock signal CLK[4] is low. In this time interval, data signal D[3] is high resulting in a pulse 213 in intermediate output A[3] and no pulse in intermediate output B[3]. During time interval 204, clock signal CLK[4] is high and clock CLK[0] is low. In this time interval, data signal D[4] is high resulting in a pulse 214 in intermediate output A[4] and no pulse in intermediate output B[4] This process repeats for each subsequent data bit in the sequence being serialized.

Figure 3:
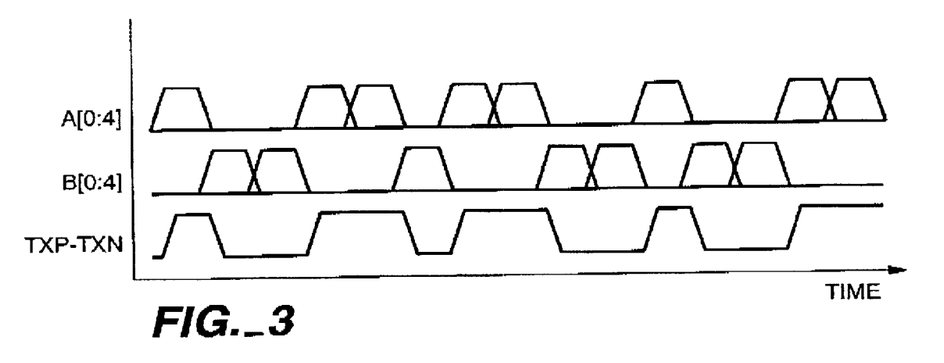
FIG. 3 is a timing diagram which illustrates the intermediate pulsed output signals and a final differential data output over time.

FIG. 3 is a timing diagram which illustrates the final stage of serialization. From the timing diagram shown in FIG. 2, the signals A[0]–A[4] and B[0]–B[4] have been copied and superimposed on one another. Again, the slew-rates of output signals A[0]–A[4] and B[0]–B[4] in FIG. 2 are shown at a nominal level. Given these signals A[0:4] and B[0:4], the output transistors M1A[0:4] and M1B[0:4] function so as to logically "OR" the "A" bus and logically "OR" the "B" bus. That is, if any signal in A[0:4] is high, then TXP-TXN will be high. Likewise, if any signal in B[0:4] is high, then TXP-TXN will be low. As shown in FIG. 3, only one signal in A[0:4] and B[0:4] is high at any give time.

Figure 4:
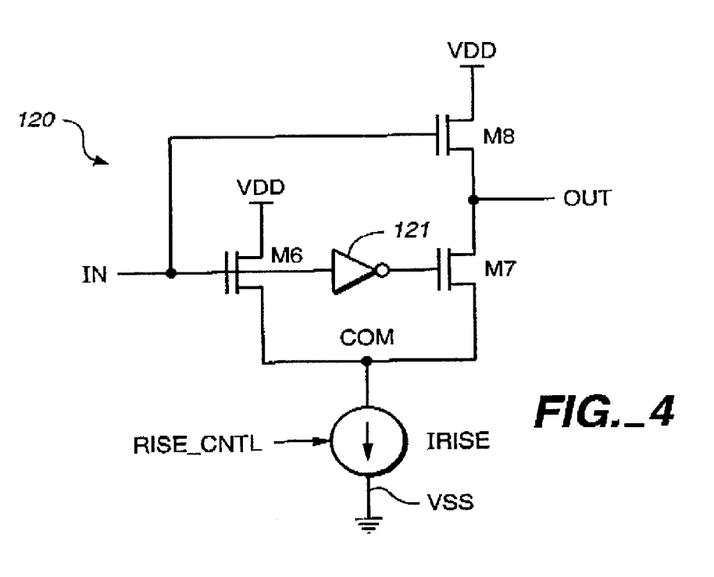
FIG. 4 is a schematic diagram, which shows a buffer used in the data serializer shown in FIG. 1 in greater detail.

FIG. 4 is a schematic diagram which shows the buffers 120A[0:4] and 120B[0:4] in greater detail. Buffer 120 includes n-channel transistors M6, M7 and M8, inverter 121 and tail current source IRISE. Transistors M6 and M7 are coupled as a differential transistor pair. Transistor M6 has a gate coupled to non-inverted input IN, a source coupled to common node COM, and a drain coupled to voltage supply terminal VDD. Transistor M7 has a gate coupled to input IN through inverter 121, a source coupled to common node COM, and a drain coupled to inverted output $\overline{OUT}$ and the source of transistor M8. Transistor M8 has a gate coupled to non-inverted input IN and a drain coupled to voltage supply terminal VDD.

Tail current source IRISE current source is coupled between common node COM and ground terminal VSS and has a current level control terminal coupled to current control input RISE_CNTL. Current source IRISE provides a controlled current, which is steered through one of the transistors M6 and M7 or the other, depending on the relative voltages on inputs IN and $\overline{IN}$.

When input IN switches high, transistors M6 and M8 turn on, and transistor M7 turns off. Transistor M8 quickly pulls output OUT high toward voltage supply terminal VDD. The logic high output voltage on output OUT is an n-channel threshold voltage below VDD. Transistor M6 holds common node COM high at an n-channel threshold voltage below VDD. When input IN goes low, transistors M6 and M8 turn off, and transistor M7 turns on. Transistor M7 shorts two nodes, COM and OUT, whose voltages are initially the same. Tail current source IRISE then begins to pull COM and OUT low toward the voltage on ground terminal VSS in a controlled manner as a function of the discharging current provided by tail current source IRISE. Thus, the fall time of output OUT can be controlled by setting the current level of tail current source IRISE through current control input RISE_CNTL. In an alternative embodiment, transistor M6 is eliminated.

Referring back to FIG. 1, with the fall times at the outputs of buffers 120A[0:4] and 120B[0:4] being controlled by RISE_CNTL, the fall times of the nets in busses A[0:4] and B[0:4] are then controlled. Transistors M5A[0:4] and M5B [0:4] are p-channel source-followers with a gain of approximately 1. When the gates of transistors M5A[0:4] and M5B[0:4] are pulled low, the sources of these transistors follow. By controlling the rise and fall times of busses A[0:4] an B[0:4], the slew rate of output signals TXN and TXP is then controlled. In an alternative embodiment (not shown) inverting buffers 120A[0:4] and 120B[0:4] are replaced with non-inverting buffers having similar controlled current sources IRISE, with the appropriate inversions of clock signals CLK[1:4,0].

Figure 5:
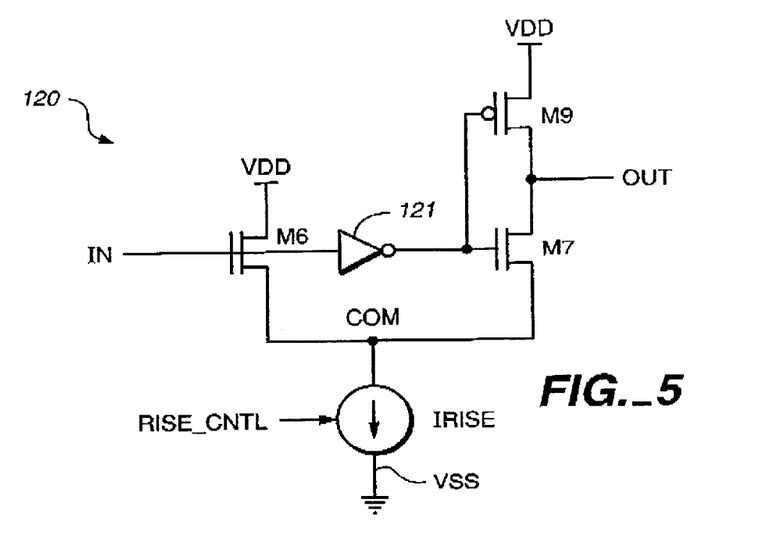
FIG. 5 is a schematic diagram which shows a buffer used in the data serializer shown in FIG. 1 according to an alternative embodiment of the present invention.

FIG. 5 is a schematic diagram which shows one of the buffers 120A[0:4] and 120B[0:4] according to an alternative embodiment of the present invention. The buffer shown in FIG. 5 is substantially the same as the buffer shown in FIG. 4, but n-channel transistor M8 is replaced with p-channel transistor M9 whose gate is coupled to input IN through inverter 121. The buffer shown in FIG. 5 operates substantially the same as the buffer shown in FIG. 4, but the logic high output voltage on output OUT is substantially VDD rather than an n-channel threshold voltage below VDD.

Figure 6:
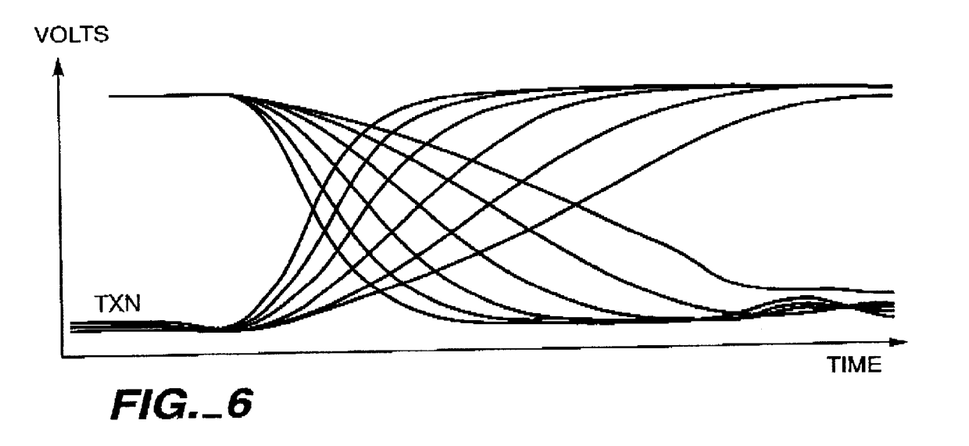
FIG. 6 is a graph illustrating a final differential data output of the data serializer over time for various slew rate adjustment settings.

FIG. 6 is a graph plotting the serializer outputs TXP and TXN over time. The graph shows an overlay of outputs TXP and TXN for six different pairs of setting for RISE_CNTL and FALL_CNTL. As shown in FIG. 6, the slew rate of data serializer 100 is adjusted by appropriate settings of RISE_CNTL and FALL_CNTL. These settings can be programmable on-chip through a set of registers, for example, or can be set on-chip or off-chip by other methods. This allows the data serializer of the present invention to be used in many different applications that may have different data rates, and the slew rate can be adjusted for each application.

In addition, the data serializer of the present invention is capable of serializing data at a high rate while consuming relatively little power as compared to serializers of the prior art. Referring back to FIG. 1, the only DC current drawn by data serializer 100 is the current drawn by tail current source 106 and load resistors RA and RB. Input stage 104 draws no DC current. Current is drawn by input stage 104 only during the switching of the transistors in input stage 104 This significantly reduces the power consumed by data serializer 100.

Also, only P-channel transistors are used to drive intermediate output buses A[0:4] and B[0:4] high and low. The voltage on VPDLO sets the logic low level for the signals on buses A[0:4] and B[0:4]. The logic high level on these buses is VDD. The voltage on VPDLO is chosen so that the gate-to-source voltage $V_{GS}$ for the "off" transistors in the M1A[0:4] and M1B[0:4] arrays is just slightly less than the gate-to-source threshold voltage $V_{TN}$ for these transistors. With the exception of signals TXP, TXN, A[0:4] and B[0:4] and the outputs of buffers 120A[0:4] and 120B[0:4] (for the embodiment shown in FIG. 4), all signals in data serializer 100 swing between power supply rails VSS and VDD.

The appropriate voltage on VPDLO can be delivered to data serializer 100 from off-chip or on-chip. In one embodiment, an on-chip feedback circuit is used to generate the appropriate voltage on VPDLO to ensure that the current in the "off" transistors in the M1A[0:4] and M1B[0:4] arrays is zero or nearly zero. In an alternative embodiment, a programmable on-chip voltage source is included with serializer 100. The voltage level on VPDLO is set by providing an appropriate digital control word to the programmable voltage source. Other methods of setting the voltage on VPDLO can also be used.

Although the present invention has been described with reference to preferred embodiments, workers skilled in the art will recognize that changes may be made in form and detail without departing from the spirit and scope of the invention. For example, the terms "high" and "low" are arbitrary terms that are interchangeable in the specification and claims, and any element can be active high or low, with appropriate inversions. In addition, the term "coupled" used in the specification and the claims can include various types of connections or couplings and can include a direct connection or a connection through one or more intermediate components.

What is claimed is:

1. A data serializer comprising:

n data inputs, where n is an integer greater than one;

n clock inputs, wherein each clock input is out of phase with the other clock inputs and corresponds to one of the n data inputs;

a differential output stage comprising first and second differential data outputs and n pairs of first and second control inputs, wherein each pair of control inputs corresponds to one of the n data inputs; and an input stage comprising, for each of the n data inputs:
a first logic AND circuit having first, second and third inputs coupled to the data input, the corresponding clock input and an inverse of the clock input that next trails the corresponding clock input in phase, respectively, and having an output which is coupled to the first control input of the corresponding pair of control inputs and has a rise time controlled by a first adjustable controlled current source and a fall time controlled by a second adjustable controlled current source; and a second logic AND circuit having first, second and third inputs coupled to an inverse of the data input, the corresponding clock input and the inverse of the clock input that next trails the corresponding clock input in phase, respectively, and an output which is coupled to the second control input of the corresponding pair of control inputs and has a rise time controlled by the first adjustable controlled current source and a fall time controlled by the second adjustable controlled current source.

2. The data serializer of claim 1 wherein the first and second logic AND circuits each comprises:

a pull-up AND gate having first, second and third inputs and an output which are coupled to the first, second and third inputs and the output of the respective logic AND circuit, wherein the output has two states, a logic high state and a high impedance state, depending on the logic states of the respective first, second and third inputs to the pull-up AND gate; and a pull-down AND gate having first, second and third inputs and an output which are coupled to the first, second and third inputs and the output of the respective logic AND circuit, wherein the output has two states, a logic low state and a high impedance state, depending on the logic states of the respective first, second and third inputs to the pull-down AND gate.

3. The data serializer of claim 2 wherein each pull-up AND gate comprises:

a logic high voltage supply terminal; and a p-channel pull-up transistor coupled between each of the corresponding first and second control inputs of the corresponding pair of control inputs and the logic high voltage supply terminal, through the first adjustable controlled current source, wherein the first adjustable controlled current source comprises a current control terminal which controls a level of current supplied by the first adjustable controlled current source.

4. The data serializer of claim 3 wherein each pull-up AND gate further comprises:

a logic NAND gate having first, second and third inputs which are coupled to the first, second and third inputs of the respective logic AND circuit and having an output coupled to a control terminal of the p-channel pull-up transistor.

5. The data serializer of claim 2 wherein each pull-down AND gate comprises:

a logic low voltage supply terminal;

a buffer which has a buffer input coupled to the third input of the respective logic AND circuit, has a buffer output, and is biased by the second adjustable controlled current source; and a first p-channel pull-down transistor which is coupled as a voltage follower between the corresponding first or second control input of the corresponding pair of control inputs and the logic low voltage supply terminal and has a pull-down control terminal driven by the buffer output.

6. The data serializer of claim 5 wherein each pull-down AND gate further comprises:

second and third p-channel pull-down transistors coupled between the corresponding first or second control input of the corresponding pair of control inputs and the logic low voltage supply terminal and having pull-down control terminals coupled to the second and first inputs, respectively of the respective logic AND circuit.

7. The data serializer of claim 5 wherein the buffer comprises a non-inverting buffer having an n-channel pull-down transistor which is coupled in series between the buffer output and the second adjustable controlled current source.

8. A data serializer comprising:

first and second voltage supply terminals, which are biased at first and second voltages, respectively;

n data inputs, where n is an integer greater than zero;

n clock inputs, wherein each clock input is out of phase with the other clock inputs and corresponds to one of the n data inputs;

differential output stage means for generating a differential serial data output based on pulses received on n pairs of first and second control inputs, wherein each pair of control inputs corresponds to one of the n data inputs; and an input stage comprising, for each of the n data inputs:

first logic AND means for driving the first control input of the corresponding pair of control inputs between the first and second voltages with a rise time controlled by a first adjustable controlled current source and a fall time controlled by a second adjustable controlled current source, based on logic states of the data input, the corresponding clock input and an inverse of the clock input that next trails the corresponding clock input in phase; and second logic AND means for driving the second control input of the corresponding pair of control inputs between the first and second voltages with a rise time controlled by the first adjustable controlled current source and a fall time controlled by the second adjustable controlled current source, based on logic states of an inverse of the data input, the corresponding clock input and the inverse of the clock input that next trails the corresponding clock input in phase.

9. The data serializer of claim 8 wherein the first and second logic AND means each comprises:

a pull-up AND gate having first, second and third inputs and an output which are coupled to the first, second and third inputs and the output of the respective logic AND means, wherein the output has two states, a logic high state and a high impedance state, depending on the logic states of the respective first, second and third inputs to the pull-up AND gate; and a pull-down AND gate having first, second and third inputs and an output which are coupled to the first, second and third inputs and the output of the respective logic AND means, wherein the output has two states, a logic low state and a high impedance state, depending on the logic states of the respective first, second and third inputs to the pull-down AND gate.

10. The data serializer of claim 9 wherein each pull-up AND gate comprises:

a logic high voltage supply terminal; and a p-channel pull-up transistor coupled between the corresponding first or second control input of the corresponding pair of control inputs and the logic high voltage supply terminal, through the first adjustable controlled current source, wherein the first adjustable controlled current source comprises a current control terminal which controls a level of current supplied by the first adjustable controlled current source.

11. The data serializer of claim 10 wherein each pull-up AND gate further comprises:

a logic NAND gate having first, second and third inputs which are coupled to the first, second and third inputs of the respective logic AND means and having an output coupled to a control terminal of the p-channel pull-up transistor.

12. The data serializer of claim 9 wherein each pull-down AND gate comprises:

a logic low voltage supply terminal;

a buffer which has a buffer input coupled to the third input of the respective logic AND means, has a buffer output, and is biased by the second adjustable controlled current source; and a first p-channel pull-down transistor which is coupled as a voltage follower between the corresponding first or second control input of the corresponding pair of control inputs and the logic low voltage supply terminal and has a pull-down control terminal driven by the buffer output.

13. The data serializer of claim 12 wherein each pull-down AND gate further comprises:

second and third p-channel pull-down transistors coupled between the corresponding first or second control input of the corresponding pair of control inputs and the logic low voltage supply terminal and having pull-down control terminals coupled to the second and first inputs, respectively, of the respective logic AND means.

14. The data serializer of claim 12 wherein the buffer comprises a non-inverting buffer having an n-channel pull-down transistor which is coupled in series between the buffer output and the second adjustable controlled current source.

15. A method of serializing a parallel data input having n data inputs, the method comprising:

(a) providing n differential transistor pairs in parallel with one another, between first and second differential data outputs and a tail current source, wherein each transistor pair comprises a respective pair of first and second control inputs;

(b) receiving the n data inputs;

(c) receiving n clock signals, wherein each clock signal is out of phase with the other clock signal and corresponds to one of the n data inputs; and (d) for each of the n data inputs received in step (b), driving the respective pair of first and second control inputs between first and second voltage levels with a rise time controlled by a first adjustable controlled current source and a fall time controlled by a second adjustable controlled current source, based on logic states of the corresponding data input, the corresponding clock signal and the clock signal that next trails the corresponding clock signal in phase.

16. The method of claim 15 wherein step (d) comprises:

(d)(1) driving the first control input of the respective pair of control inputs between the first and second voltage levels based on a logic AND of the logic states of the corresponding data input, the corresponding clock signal and an inverse of the clock signal that next trails the corresponding clock signal in phase; and (d)(2) driving the second control input of the respective pair of control inputs between the first and second voltage levels based on a logic AND of the logic states of an inverse of the data input, the corresponding clock signal and the inverse of the clock signal that next trails the corresponding clock signal in phase.

\* \* \* \* \*